United States Patent
Bondar et al.

(10) Patent No.: US 11,604,081 B2
(45) Date of Patent: Mar. 14, 2023

(54) INTEGRATED ROTATION ANGLE DETERMINING SENSOR UNIT IN A MEASURING SYSTEM FOR DETERMINING A ROTATION ANGLE

(71) Applicant: TDK-Micronas GmbH, Freiburg (DE)

(72) Inventors: Yan Bondar, Waldkirch (DE); Marcus Christian Meyer, Malsch (DE); Hans Christian Paul Dittmann, Pforzheim (DE)

(73) Assignee: TDK-Micronas GmbH, Freiburg (DE)

( * ) Notice: Subject to any disclaimer, the term of this patent is extended or adjusted under 35 U.S.C. 154(b) by 212 days.

(21) Appl. No.: 17/007,582

(22) Filed: Aug. 31, 2020

(65) Prior Publication Data

US 2021/0063204 A1 Mar. 4, 2021

(30) Foreign Application Priority Data

Aug. 30, 2019 (DE) ...................... 10 2019 006 138.1

(51) Int. Cl.
*G01D 5/14* (2006.01)
*G01R 33/07* (2006.01)
*G01B 7/30* (2006.01)

(52) U.S. Cl.
CPC ............... *G01D 5/145* (2013.01); *G01B 7/30* (2013.01); *G01R 33/072* (2013.01)

(58) Field of Classification Search
CPC ......... G01D 5/145; G01B 7/30; G01R 33/072
See application file for complete search history.

(56) References Cited

U.S. PATENT DOCUMENTS

| 6,545,462 | B2 | 4/2003 | Schott et al. |
| 8,749,005 | B1 | 6/2014 | Foletto et al. |
| 9,470,552 | B2 | 10/2016 | Ausserlechner |
| 9,625,276 | B2 | 4/2017 | Ausserlechner |
| 9,982,989 | B2 * | 5/2018 | Ausserlechner ....... G01R 33/07 |
| 10,132,649 | B2 | 11/2018 | Janisch |
| 10,746,569 | B2 | 8/2020 | Ausserlechner |
| 2011/0043197 | A1 | 2/2011 | Trontelj |

(Continued)

FOREIGN PATENT DOCUMENTS

| CN | 104487807 A | 4/2015 |
| CN | 104833305 A | 8/2015 |

(Continued)

*Primary Examiner* — Reena Aurora
(74) *Attorney, Agent, or Firm* — Muncy, Geissler, Olds & Lowe, P.C.

(57) ABSTRACT

An integrated rotation angle determining sensor unit in a measuring system for determining a rotation angle, comprising a shaft, rotatable around a rotation axis, having a transducer, a first semiconductor layer designed as a die being provided, which has an upper side arranged perpendicularly to the rotation axis and an underside and a first Hall sensor system monolithically formed in the first semiconductor layer, and a second semiconductor layer designed as a die being provided, which has an upper side arranged perpendicularly to the rotation axis and an underside and a second Hall sensor system monolithically formed in the second semiconductor layer, each Hall sensor system including at least one first Hall sensor and a second Hall sensor and a third Hall sensor.

17 Claims, 2 Drawing Sheets

(56) References Cited

U.S. PATENT DOCUMENTS

| | | | | |
|---|---|---|---|---|
| 2011/0187351 A1* | 8/2011 | Hunger | ............. | G01D 5/145 |
| | | | | 324/207.2 |
| 2015/0219472 A1 | 8/2015 | Ausserlechner | | |
| 2018/0335294 A1* | 11/2018 | Ausserlechner | ....... | G01D 5/145 |
| 2019/0383885 A1* | 12/2019 | Sitorus | ............. | G01R 33/09 |

FOREIGN PATENT DOCUMENTS

| | | |
|---|---|---|
| CN | 108204785 A | 6/2018 |
| ER | 1 182 461 A2 | 2/2002 |

\* cited by examiner

INTEGRATED ROTATION ANGLE DETERMINING SENSOR UNIT IN A MEASURING SYSTEM FOR DETERMINING A ROTATION ANGLE

This nonprovisional application claims priority under 35 U.S.C. § 119(a) to German Patent Application No. 10 2019 006 138.1, which was filed in Germany on Aug. 30, 2019, and which is herein incorporated by reference.

BACKGROUND OF THE INVENTION

Field of the Invention

The present invention relates to an integrated rotation angle determining sensor unit in a measuring system for determining a rotation angle.

Description of the Background Art

Integrated rotation angle determining sensor units are known, in particular, from applications in the area of motor vehicles. For example, the position of a shaft is determined from the measurement of the magnetic flux with the aid of magnetic field sensors.

SUMMARY OF THE INVENTION

It is therefore an object of the present invention to provide an integrated rotation angle determining sensor unit in a measuring system for determining a rotation angle, which refines the prior art and, in particular, provides a particularly failsafe and simple and cost-effective alternative.

In an exemplary embodiment of the invention, an integrated rotation angle determining sensor unit is provided in a measuring system for determining a rotation angle. In addition to the integrated rotation angle determining sensor unit, the measuring system also comprises a shaft, rotatable around a rotation axis, a transducer being disposed on the shaft.

The transducer can be designed as a permanent magnet and can be disposed on the end face of the shaft.

The rotation angle determining sensor unit comprises a first semiconductor layer designed as a die, with an upper side and an underside arranged perpendicularly to the rotation axis.

A first Hall sensor system of a monolithic design is formed in the first semiconductor layer.

The rotation angle determining sensor unit furthermore comprises a second semiconductor layer designed as a die, with an upper side and an underside arranged perpendicularly to the rotation axis.

A second Hall sensor system of a monolithic design is formed in the second semiconductor layer.

Each Hall sensor system can include at least one Hall sensor, a second Hall sensor and a third Hall sensor.

The three Hall sensors of the first Hall sensor system are arranged along a first circle section, which runs in parallel to the upper side of the first semiconductor layer and is arranged concentrically to the rotation axis.

The three Hall sensors of the second Hall sensor system are arranged along a second circle section, which runs in parallel to the upper side of the second semiconductor layer and is arranged concentrically to the rotation axis.

The first semiconductor layer and the second semiconductor layer can be formed on different dies. In other words, at least two dies are required.

A particular upper side of the particular semiconductor layer can be formed in parallel to a particular underside of a particular semiconductor layer.

It should be noted that the term, circle section, can be used synonymously with the term, circle segment or circle arc.

It should also be noted that the particular upper side of the particular semiconductor layer can also form the particular upper side of the particular die, and the particular underside of the particular semiconductor layer also can form the particular underside of the particular die.

The first Hall sensor system can be provided with a redundant design with respect to the second Hall sensor system.

An activation and evaluation unit can be disposed within the first semiconductor layer and/or the second semiconductor layer in each case.

All sensors of the rotation angle determining sensor unit can be in an electrical operational connection with an activation and evaluation unit.

The particular activation and evaluation unit comprises a monolithically integrated processor unit. The semiconductor layer can be designed as the silicon semiconductor wafer.

It is understood that the term, integrated rotation angle determining sensor unit, can cover in each case at least one Hall sensor system monolithically integrated into the first semiconductor layer, including an activation and evaluation unit also monolithically integrated into the first semiconductor layer, and a Hall sensor system monolithically integrated into the second semiconductor layer, including an activation and evaluation unit also monolithically integrated into the second semiconductor layer.

If additional structural elements, in particular sensors for measuring mechanical stresses and/or other types of magnetic field sensors, are provided as part of the rotation angle determining sensor unit, the additional structural elements may be disposed within the shared IC housing.

The three Hall sensors can be designed to be spaced a distance apart along the particular circle circumference in the two sensor systems, a high resolution is thereby achieved in determining the rotation angle. Moreover, static interference fields, in particular, such as the earth's magnetic field, are compensated for with the aid of a differential examination.

In particular in applications in safety-relevant areas, for example in determining rotation angles of a steering wheel in a motor vehicle, a redundant design is mandatory.

Another advantage is that, in addition to suppressing static magnetic interference fields, each of the Hall sensor systems determines the same components of the magnetic field generated by the transducer in the same way.

It is understood that the center point of the first circle section and/or the center point of the second circle section is/are penetrated by an imaginary extension of the rotation axis.

The Hall sensors can be designed to be identical or nearly identical, in particular with respect to the type and geometric dimensions.

The first circle section can have a larger or smaller radius than the second circle section. In another specific embodiment, the first circle section and the second circle section have the same radius.

The two dies can be arranged side by side on a metal carrier, the first circle section being designed as a semicircle and the second circle section as a semicircle, and together forming a full circle. The Hall sensors of the first Hall sensor system and the Hall sensors of the second Hall sensor system are preferably arranged along the shared full circle formed concentrically around the rotation axis.

The Hall sensors can be arranged in a rotationally symmetrical manner. The radius can be, for example, 1 mm.

The particular Hall sensors of the two Hall sensor systems can enclose an angle of 60° with respect to each other when designed as a full circle, i.e. the total of six Hall sensors are evenly distributed along the circumference. If a number N of more than six Hall sensors are arranged along the full circle, the angle is determined from the ratio of 360°/N.

A trench can be arranged between the two dies. Mechanical stresses are avoidable hereby.

The rotation angle determining sensor unit can comprise a first magnetoresistive sensor unit with at least one magnetoresistive sensor. One part of the magnetoresistive sensor unit is preferably formed on the upper side of the first semiconductor layer, and another part is formed on the upper side of the second semiconductor layer.

For example, a first half of the magnetoresistive sensor unit covers one part of the first semiconductor layer, and a second half of the magnetoresistive sensor unit covers one part of the second semiconductor layer. The first magnetoresistive sensor unit can include exactly two or more magnetoresistive sensors.

The magnetoresistive sensors can be designed as TMR or GMR or AMR sensors. It is understood that the magnetoresistive sensors each include four partial sensor elements, preferably arranged in the form of a Wheatstone bridge.

The magnetoresistive sensors can be arranged on the surface of the particular die, passivated with the aid of a dielectric layer, and are connected to the activation and evaluation unit formed in the particular semiconductor layer by electrical printed conductors, in particular bonding wires.

The magnetoresistive sensors can be arranged side by side or one above the other or one inside the other.

The Hall sensors of the first Hall sensor system can form a first semicircle along the first circle section, and the Hall sensors of the second Hall sensor system can form a second semicircle along the second circle section. The two semicircles are preferably each arranged concentrically around the rotation axis.

The three Hall sensors of the two Hall sensor systems each can enclose an angle of 120° with respect to each other.

The first Hall sensor of each Hall sensor system can encloses an angle of 90° with respect to the second Hall sensor of the same Hall sensor system and an angle of 180° with respect to the third Hall sensor of the same Hall sensor system.

The underside of the first semiconductor layer can be disposed on an upper side of a metal carrier, and the underside of the second semiconductor layer can be disposed on the underside of the metal carrier and thereby form a stacked arrangement. In other words, the two dies form a sandwich arrangement in connection with the metal carrier, which is also referred to as a lead frame.

In the stacked arrangement, an imaginary extension of the rotation axis penetrates the two semiconductor layers, for example, in the center point of the two circle sections. The first circle section designed as a semicircle preferably lies on the second circle section designed as a semicircle in a projection along the rotation axis.

A magnetoresistive sensor unit formed on the upper side of the first semiconductor layer and having at least one magnetoresistive sensor can be provided in the stacked or sandwich arrangement.

A magnetoresistive sensor unit formed on the upper side of the second semiconductor layer and having at least one magnetoresistive sensor can be provided in the stacked arrangement.

The particular magnetoresistive sensor unit can be penetrated by an imaginary extension of the rotation axis.

The first Hall sensors and the second Hall sensors and the third Hall sensors of the two Hall sensor systems each can enclose the same offset angle with respect to each other in the stacked design, with regard to a shared center point of the two circle sections in each case.

The angle of the rotation or the offset angle of the Hal sensors of the first Hall sensor system is preferably less than 20° or less than 10° with respect to the Hall sensors of the second Hall sensor system.

Each Hall sensor may be designed as a Hall plate having at least four terminals.

The two Hall sensor systems each can include a fourth Hall sensor or each can include a fourth Hall sensor and a fifth Hall sensor, or each can include a fourth Hall sensor and a fifth Hall sensor and a sixth Hall sensor.

An advantage is that the angle resolution may be increased with the design having more than three Hall sensors. In an example, each Hall sensor system includes a maximum of seven Hall sensors.

Each Hall sensor can have a first main extension surface, the first main extension surface being formed in parallel to the upper side of the particular semiconductor layer. The first main extension surface has a significantly larger surface than the other surfaces of the particular Hall sensor.

A second main extension surface opposite the first main extension surface can be formed in parallel to the first main extension surface in each Hall sensor.

At least one z component of the magnetic field is preferably measured with the aid of the magnetic field sensors, i.e. with the aid of the Hall sensors of the Hall sensor systems and the other types of magnetic field sensors which may be formed.

In the present case, the z component can be a vertical component, i.e. a component perpendicular to the upper side of the semiconductor layer or perpendicular to the two main extension surfaces of the particular Hall sensors.

The first Hall sensor system and the second Hall sensor system can have the same number of Hall sensors.

The particular semiconductor layer can be designed as a silicon semiconductor layer.

The Hall sensors can each measure the same component of the magnetic field generated with the aid of the transducer. The Hall sensors can measure the component of the magnetic field designated as the z component and formed in the direction of the rotation axis.

Both the components of the magnetic field can be formed in parallel to the upper side of the semiconductor layer and can be designed as the x component and the y component and are measured with the aid of the magnetoresistive sensors.

The x component and the y component and the z component form a Cartesian coordinate system.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
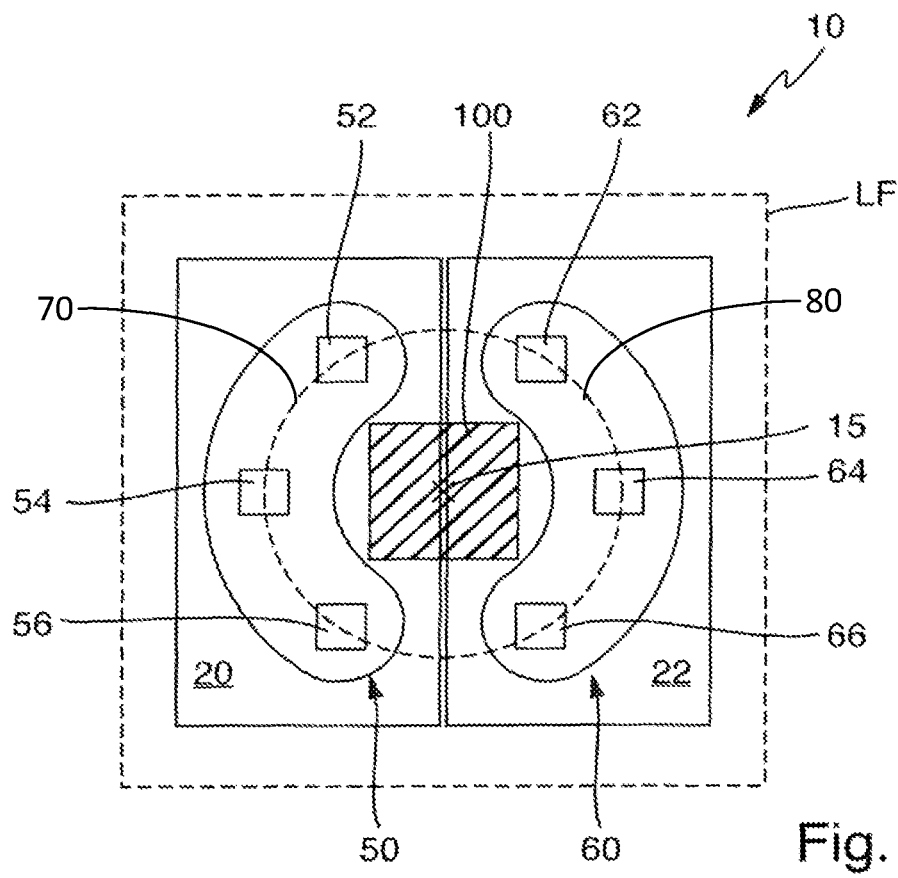
FIG. 1 shows a representation of an exemplary embodiment according to the invention of a rotation angle measuring sensor unit.

The illustration in FIG. 1 shows a representation of a first specific embodiment according to the invention of an integrated rotation angle measuring sensor unit 10.

Rotation angle determining sensor unit 10 is part of a measuring system, which is not illustrated in greater detail, for a determination of the rotation angle of a shaft. In addition to the shaft rotatable around a rotation axis 15, the measuring system also comprises a transducer arranged on the shaft.

The transducer is generally designed as a permanent magnet and is preferably disposed on the end face of the shaft.

Rotation angle determining sensor unit 10 preferably includes a first semiconductor layer 20 comprising silicon or made up of silicon and a second semiconductor layer 22. First semiconductor layer 20 and second semiconductor layer 22 are each designed as so-called dies.

First semiconductor layer 20 has an upper side 30 formed perpendicularly to rotation axis 15 and an underside 40. Underside 40 is disposed on a metal carrier LF or lead frame.

A first Hall sensor system 50 of a monolithic design is formed in first semiconductor layer 20.

An activation and evaluation circuit, which is not illustrated, is formed in first semiconductor layer 20, the activation and evaluation circuit being connected to first Hall sensor system 50.

First Hall sensor system 50 includes at least one first Hall sensor 52, a second Hall sensor 54 and a third Hall sensor 56.

The three Hall sensors 52, 54 and 56 of first Hall sensor system 50 are arranged on a first circle section 70, which runs in parallel to upper side 30 of semiconductor layer 20 and is arranged concentrically around rotation axis 15.

A second Hall sensor system 60 of a monolithic design is formed in second semiconductor layer 22.

An activation and evaluation circuit, which is not illustrated, is formed in second semiconductor layer 22, the activation and evaluation circuit being connected to second Hall sensor system 60.

Second Hall sensor system 60 includes at least one first Hall sensor 62, a second Hall sensor 64 and a third Hall sensor 66.

The three Hall sensors 62, 64 and 66 of second Hall sensor system 60 are arranged on a second circle section 80, which runs in parallel to upper side 32 of semiconductor layer 22 and is arranged concentrically around rotation axis 15.

First Hall sensor system 50 is designed to be redundant with respect to second Hall sensor system 60 and measures a component of the magnetic field preferably generated along rotation axis 15 with the aid of the transducer.

In both Hall sensor systems 50 and 60, the three Hall sensors 52, 62, 54, 64, 56 and 66 in each case are formed, spaced a distance apart, along particular circle circumference 70 and 80.

The three Hall sensors 52, 62, 54, 64, 56 and 66 of the two Hall sensor systems 50 and 60 each preferably enclose an angle of 90° with respect to each other.

Hall sensors 52, 62, 54, 64, 56 and 66 are each preferably designed as a Hall plate having at least four terminals.

In the present case, the two dies are arranged side by side on metal carrier LF, first circle section 70 and second circle section 80 together forming a full circle, and Hall sensors 52, 54, 56 of first Hall sensor system 50 and Hall sensors 62, 64, 66 of second Hall sensor system 60 being arranged along the shared full circle formed concentrically around rotation axis 15.

Hall sensors 52, 54, 56, 62, 64, 66 are arranged along the full circle in a rotationally symmetrical manner.

A first magnetoresistive sensor unit 100, including at least one magneto resistive sensor, which is not illustrated, is arranged on the surface of the two dies. One part of first magnetoresistive sensor unit 100 is formed on the upper side of first semiconductor layer 20 and on the upper side of second semiconductor layer 22, the imaginary extension of rotation axis 15 preferably penetrating first magnetoresistive sensor 100 in its surface center of gravity.

Figure 2:
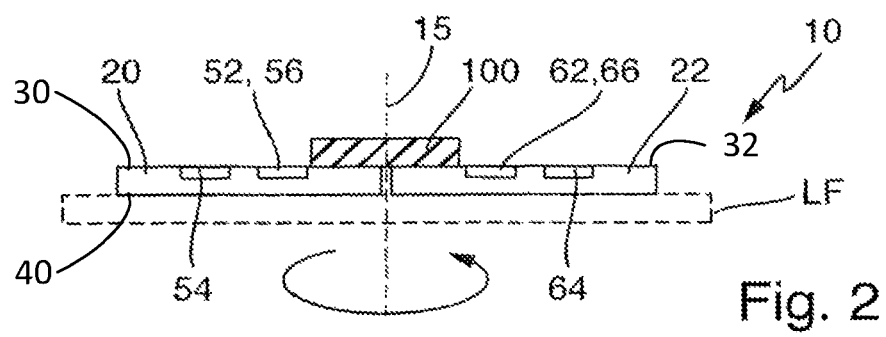
FIG. 2 shows a cross-sectional representation of the rotation angle measuring sensor unit.

The illustration in FIG. 2 shows a cross-sectional representation of the first specific embodiment according to the invention.

Another die, which includes the first magnetoresistive sensor unit 100, is disposed on the surface of the two dies arranged side by side. First magnetoresistive sensor unit 100 is disposed centrically on the two semiconductor layers 20, 22. A gap is formed between the two semiconductor layers 20, 22 or between the two dies arranged side by side, among other things for the purpose of reducing the mechanical stress.

Rotation axis 15 centrically penetrates first magnetoresistive sensor unit 100.

Figure 3:
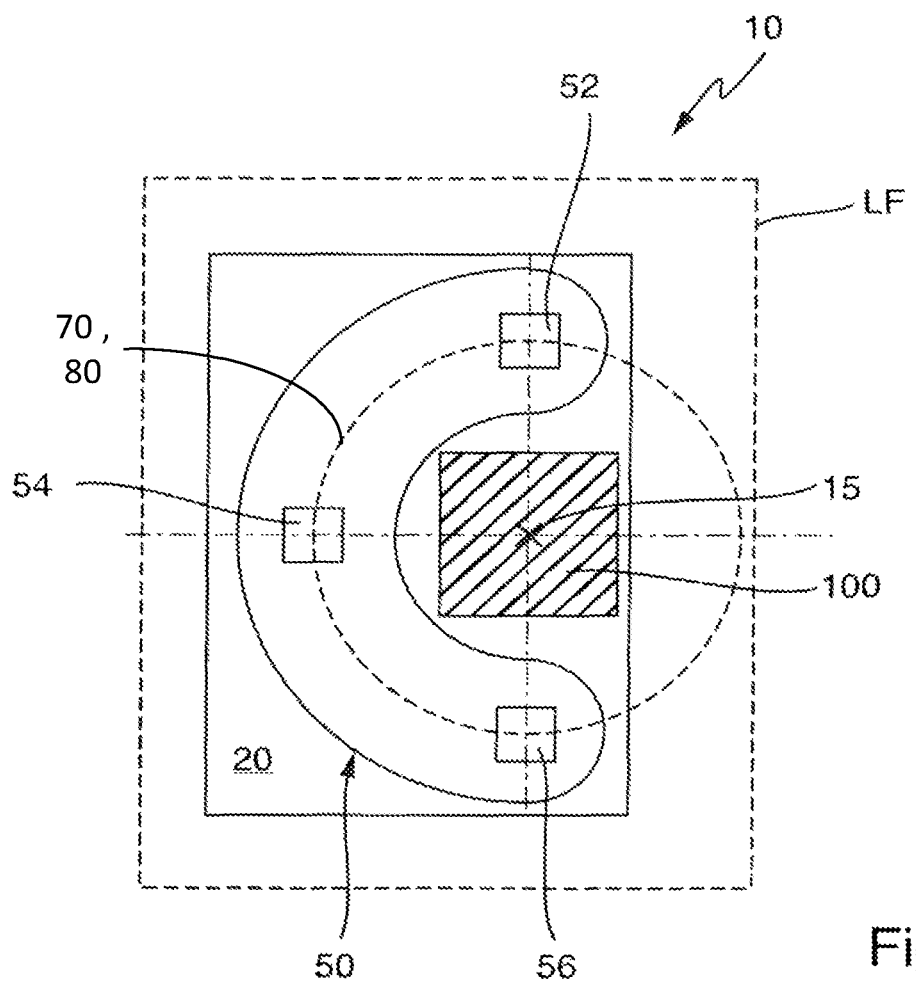
FIG. 3 shows a representation of an exemplary embodiment according to the invention of the rotation angle measuring sensor unit.
Figure 4:
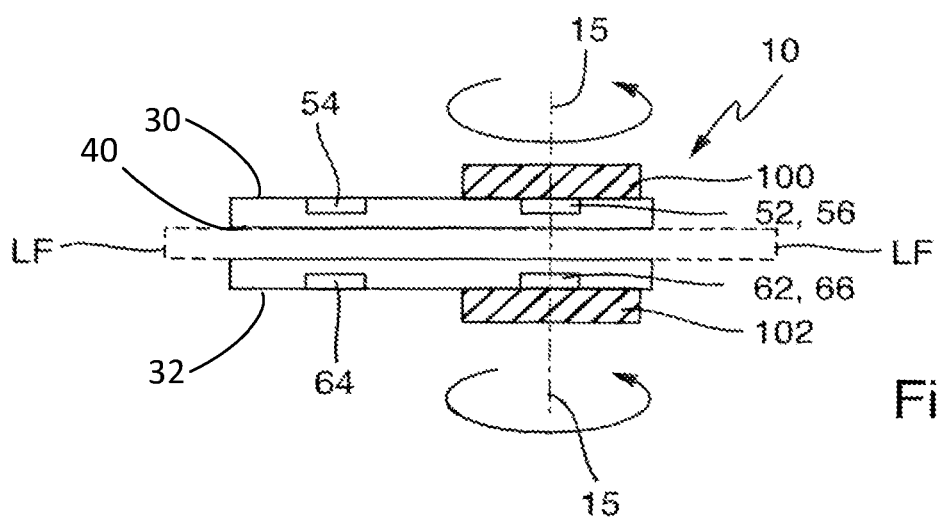
FIG. 4 shows a cross-sectional representation of the rotation angle measuring sensor unit from FIG. 3.

The illustration in FIG. 3 shows a representation of a second specific embodiment according to the invention of the integrated rotation angle measuring sensor unit. The illustration in FIG. 4 shows a sectional view of the second specific embodiment according to the invention. Only the differences from the first specific embodiment are explained below.

The underside of first semiconductor layer 20 is disposed on an upper side of metal carrier LF, and the underside of second semiconductor layer 22 is disposed on the underside of metal carrier LF. In the present top view, only first semiconductor layer 20 is illustrated for reasons of clarity.

An imaginary extension of rotation axis 15 does not penetrate the two semiconductor layers 20, 22 in the particular surface center of gravity of semiconductor layers 20, 22.

Particular first Hall sensor 52, 62 of each Hall sensor system 50, 60 encloses an angle of 90° with respect to particular second Hall sensor 54, 64 of the same Hall sensor system 50, 60 and an angle of 180° with respect to third Hall sensor 56, 66 of the same Hall sensor system 50, 60.

Hall sensors 52, 54, 56 of first Hall sensor system 50 are arranged along first circle section 70 and form a first semicircle.

Hall sensors 62, 64, 66 of second Hall sensor system 60 are arranged along second circle section 80 and form a second semicircle.

The two semicircles are each arranged concentrically around rotation axis 15.

First magnetoresistive sensor unit 100, including at least one magnetoresistive sensor, is arranged on the upper side of first semiconductor layer 20.

Second magnetoresistive sensor unit 102, including at least one magnetoresistive sensor, is arranged on the upper side of second semiconductor layer 22.

Particular magnetoresistive sensor unit 100, 102 is centrically penetrated by an imaginary extension of rotation axis 15.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated rotation angle determining sensor unit in a measuring system for determining a rotation angle, the integrated rotation angle determining sensor unit comprising:
    a shaft rotatable around a rotation axis;
    a transducer;
    a first semiconductor layer designed as a die, which has an upper side arranged substantially perpendicularly to the rotation axis, an underside and a first Hall sensor system monolithically formed in the first semiconductor layer; and
    a second semiconductor layer designed as a die, which has an upper side arranged substantially perpendicularly to the rotation axis, an underside and a second Hall sensor system monolithically formed in the second semiconductor layer,
    wherein the first and Hall sensor system includes at least one first Hall sensor, a second Hall sensor, and a third Hall sensor,
    wherein the second Hall sensor system includes at least one first Hall sensor, a second Hall sensor, and a third Hall sensor,
    wherein the first, second, and third Hall sensors of the first Hall sensor system are formed along a first circle section, which runs in parallel to the upper side of the first semiconductor layer and is arranged concentrically to the rotation axis, and
    wherein the first, second, and third Hall sensors of the second Hall sensor system are arranged along a second circle section, which runs in parallel to the upper side of the second semiconductor layer and is arranged concentrically to the rotation axis.

2. The integrated rotation angle determining sensor unit according to claim 1,
    wherein the Hall sensors of the first and second Hall sensor systems have a substantially identical design, and
    wherein the first circle section has a larger or smaller radius than the second circle section.

3. The integrated rotation angle determining sensor unit according to claim 1,
    wherein the first and second semiconductor layers are arranged side by side on a metal carrier, the first circle section and the second circle section together forming a full circle, and
    wherein the Hall sensors of the first Hall sensor system and the Hall sensors of the second Hall sensor system are arranged along the full circle formed concentrically around the rotation axis.

4. The integrated rotation angle determining sensor unit according to claim 3, wherein the Hall sensors of the first and second Hall sensor systems are arranged in a rotationally symmetrical manner.

5. The integrated rotation angle determining sensor unit according to claim 1, further comprising:
    a first magnetoresistive sensor unit with at least one magnetoresistive sensor, the first magnetoresistive sensor unit being formed on the upper side of the first semiconductor layer and on the upper side of the second semiconductor layer.

6. The integrated rotation angle determining sensor unit according to claim 1,
    wherein the underside of the first semiconductor layer is disposed on an upper side of a metal carrier, and the underside of the second semiconductor layer is disposed on the underside of the metal carrier, and
    wherein an imaginary extension of the rotation axis penetrates the two semiconductor layers.

7. The integrated rotation angle determining sensor unit according to claim 1, wherein the Hall sensors of the first Hall sensor system form a first semicircle along the first circle section, and the Hall sensors of the second Hall sensor system form a second semicircle along the second circle section, the first and second semicircles each being arranged concentrically around the rotation axis.

8. The integrated rotation angle determining sensor unit according to claim 1,
    wherein the underside of the first semiconductor layer is disposed on an upper side of a metal carrier, and the underside of the second semiconductor layer is disposed on an underside of the metal carrier,
    wherein the integrated rotation angle determining sensor unit further comprises:
        a first magnetoresistive sensor unit formed on the upper side of the first semiconductor layer, the first magnetoresistive sensor unit having at least one magnetoresistive sensor; and
        a second magnetoresistive sensor unit formed on the upper side of the second semiconductor layer, the second magnetoresistive sensor unit having at least one magnetoresistive sensor.

9. The integrated rotation angle determining sensor unit according to claim 8, wherein the first and second magnetoresistive sensor units are penetrated by an imaginary extension of the rotation axis.

10. The integrated rotation angle determining sensor unit according to claim 1,
    wherein the first Hall sensor of the first Hall sensor system encloses an angle of 90° with respect to the second Hall sensor of the first Hall sensor system and an angle of 180° with respect to the third Hall sensor of the first Hall sensor system, and
    wherein the first Hall sensor of the second Hall sensor system encloses an angle of 90° with respect to the second Hall sensor of the second Hall sensor system and an angle of 180° with respect to the third Hall sensor of the second Hall sensor system.

11. The integrated rotation angle determining sensor unit according to claim 1, wherein the Hall sensors of the first and second Hall sensor systems are designed as a Hall plate having four terminals.

12. The integrated rotation angle determining sensor unit according to claim 1, wherein the first and second Hall sensor systems each include a fourth Hall sensor or each include a fourth Hall sensor and a fifth Hall sensor, or each include a fourth Hall sensor and a fifth Hall sensor and a sixth Hall sensor.

13. The integrated rotation angle determining sensor unit according to claim 1, wherein the first semiconductor layer is a silicon semiconductor layer and/or the second semiconductor layer is a silicon semiconductor layer.

14. The integrated rotation angle determining sensor unit according to claim 1, wherein the first Hall sensor system and the second Hall sensor system have a same number of Hall sensors.

15. The integrated rotation angle determining sensor unit according to claim 1, wherein the Hall sensors of the first and second Hall sensor systems measure a same component of the magnetic field generated via the transducer.

16. The integrated rotation angle determining sensor unit according to claim 1,
wherein the Hall sensors of the first and second Hall sensor systems have a substantially identical design, and
wherein the first circle section and the second circle section have a same radius.

17. The integrated rotation angle determining sensor unit according to claim 1, wherein the first and second Hall sensor systems are configured to be redundant to each other.

* * * * *